United States Patent
Bohannon et al.

(10) Patent No.: US 10,530,363 B2
(45) Date of Patent: Jan. 7, 2020

(54) INTERFERENCE MONITORING WITH TRANSMITTER ELECTRODES

(71) Applicant: Synaptics Incorporated, San Jose, CA (US)

(72) Inventors: Eric Bohannon, Rochester, NY (US); Steve Lo, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 156 days.

(21) Appl. No.: 15/692,156

(22) Filed: Aug. 31, 2017

(65) Prior Publication Data

US 2019/0068189 A1 Feb. 28, 2019

(51) Int. Cl.
*H03K 17/96* (2006.01)
*G06F 3/041* (2006.01)
*G06F 3/046* (2006.01)

(52) U.S. Cl.
CPC .......... *H03K 17/962* (2013.01); *G06F 3/046* (2013.01); *G06F 3/0418* (2013.01); *H03K 17/9622* (2013.01); *H03K 2217/96031* (2013.01); *H03K 2217/96071* (2013.01)

(58) Field of Classification Search
CPC ...... H03K 17/962; G06F 3/046; G06F 3/0418
See application file for complete search history.

(56) References Cited

U.S. PATENT DOCUMENTS

| | | | |
|---|---|---|---|
| 9,405,421 B2* | 8/2016 | Hotelling | G06F 3/0362 |
| 2004/0217886 A1* | 11/2004 | Horton | G01D 5/24 |
| | | | 341/33 |
| 2009/0273573 A1* | 11/2009 | Hotelling | G06F 3/0362 |
| | | | 345/173 |
| 2010/0302202 A1* | 12/2010 | Takeuchi | G06F 3/0412 |
| | | | 345/174 |
| 2011/0074732 A1* | 3/2011 | Reynolds | G06F 3/041 |
| | | | 345/174 |
| 2011/0148435 A1* | 6/2011 | Schwartz | G06F 3/0416 |
| | | | 324/658 |
| 2011/0157069 A1* | 6/2011 | Zhuang | G06F 3/044 |
| | | | 345/174 |
| 2012/0068966 A1* | 3/2012 | Washburn | G06F 3/0418 |
| | | | 345/174 |

(Continued)

*Primary Examiner* — Nitin Patel
*Assistant Examiner* — Amy Onyekaba
(74) *Attorney, Agent, or Firm* — Ferguson Braswell Fraser Kubasta PC

(57) ABSTRACT

A method of capacitive sensing may include transmitting a first sensing signal along a first transmitter electrode among various transmitter electrodes of an input device. The method may further include obtaining, using various receiver electrodes in the input device, a first resulting signal in response to the first sensing signal being transmitted along the first transmitter electrode. The method may further include obtaining a second resulting signal from a second transmitter electrode among the transmitter electrodes. The method may further include determining, using the second resulting signal, interference along the second transmitter electrode. The method may further include adjusting, using the interference along the second transmitter electrode, the first resulting signal to produce an adjusted resulting signal. The method may further include determining, using the adjusted resulting signal, positional information regarding a location of an input object in a sensing region of the input device.

20 Claims, 7 Drawing Sheets

(56) References Cited

U.S. PATENT DOCUMENTS

| | | | | |
|---|---|---|---|---|
| 2012/0206154 A1* | 8/2012 | Pant | G06F 3/0416 | 324/613 |
| 2013/0027359 A1* | 1/2013 | Schevin | G06F 3/0416 | 345/177 |
| 2013/0162585 A1* | 6/2013 | Schwartz | G06F 3/0416 | 345/174 |
| 2013/0176266 A1* | 7/2013 | Kao | G06F 3/0416 | 345/174 |
| 2014/0085254 A1* | 3/2014 | Tenuta | G06F 3/0414 | 345/174 |
| 2014/0300575 A1* | 10/2014 | Chang | G06F 3/0418 | 345/174 |
| 2015/0029134 A1* | 1/2015 | Liu | G06F 3/044 | 345/174 |
| 2015/0042357 A1* | 2/2015 | Haga | G06F 3/0418 | 324/601 |
| 2015/0054754 A1* | 2/2015 | Han | G06F 3/0418 | 345/173 |
| 2015/0220177 A1* | 8/2015 | Park | G06F 3/044 | 345/174 |
| 2015/0277621 A1* | 10/2015 | Roberson | G06F 3/044 | 345/174 |
| 2015/0309612 A1* | 10/2015 | Morein | G06F 3/044 | 345/174 |
| 2015/0309658 A1* | 10/2015 | Stevenson | G06F 3/0418 | 345/176 |
| 2016/0018921 A1* | 1/2016 | Matlick | G06F 3/0416 | 345/174 |
| 2016/0291766 A1* | 10/2016 | Shen | G06F 3/0416 | |
| 2017/0090641 A1* | 3/2017 | Khazeni | G06F 3/0416 | |
| 2017/0090670 A1* | 3/2017 | Stevenson | G06F 3/0418 | |
| 2017/0153763 A1* | 6/2017 | Vavra | G06F 3/0488 | |
| 2017/0168604 A1* | 6/2017 | Schwartz | G06F 3/044 | |
| 2017/0192604 A1* | 7/2017 | Stevenson | G06F 3/044 | |

* cited by examiner

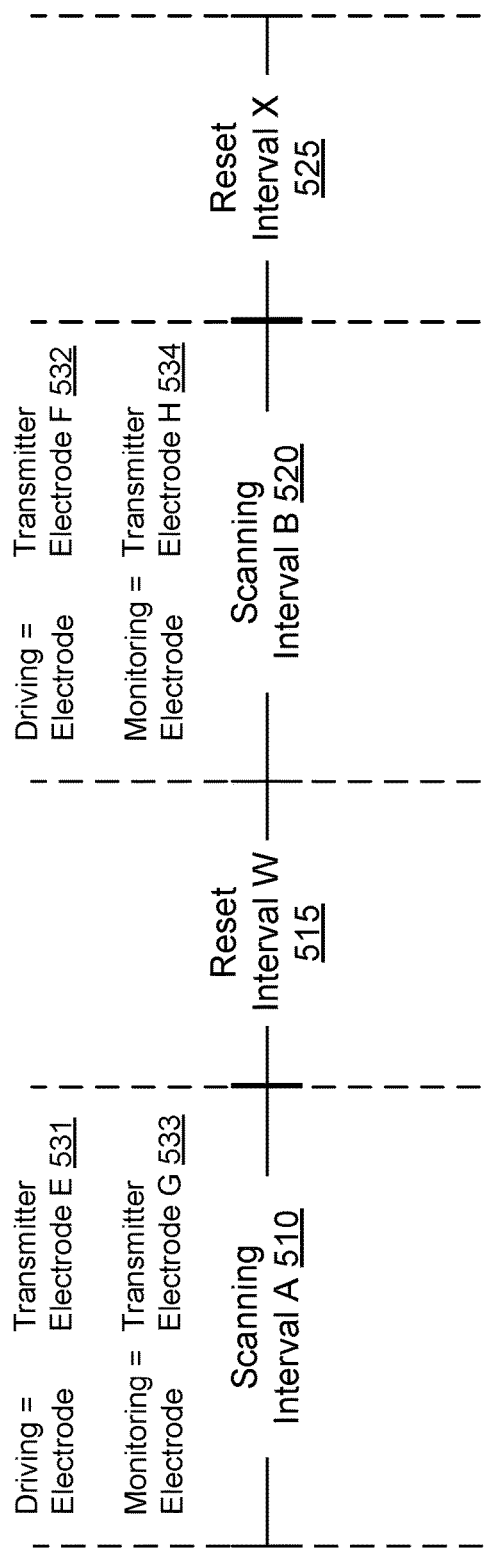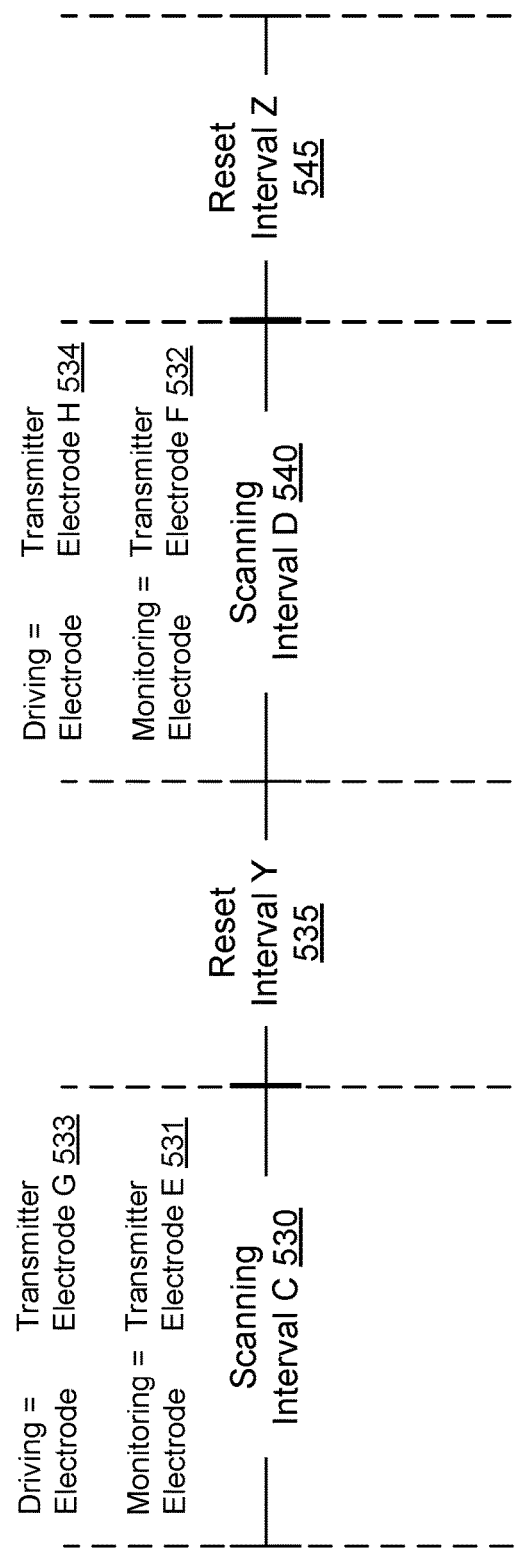
FIG. 5

INTERFERENCE MONITORING WITH TRANSMITTER ELECTRODES

FIELD

This disclosed technology generally relates to electronic devices and specifically to interference detection with capacitive sensing devices.

BACKGROUND

Input devices, including proximity sensor devices (also commonly called touchpads or touch sensor devices), are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system.

Moreover, interference within an input device is a typical problem with respect to various proximity sensing techniques. For example, the amount of interference in an input device may affect the accuracy of capacitive measurements obtained in the input device as well as which types of sensing signals can be transmitted effectively along transmitter electrodes in the input device. Likewise, with many input devices, system resources are usually divided between interference detection and proximity sensing, which may reduce the frame time that is dedicated to capacitive sensing for input objects. Thus, improved techniques are desired that utilize the preexisting resources in an input device in order to perform interference detection and removal.

SUMMARY

In one embodiment, an input device includes various transmitter electrodes coupled to driving circuitry. The driving circuitry transmit one or more sensing signals along a transmitter electrode among the transmitter electrodes. The input device further includes a receiver electrode coupled to a first sensing circuitry. The first sensing circuitry obtains a first resulting signal from the receiver electrode in response to transmitting the one or more sensing signals. The first resulting signal is used for determining positional information regarding an input object located in a sensing region of the input device. The input device further includes a second sensing circuitry coupled to a second transmitter electrode among the transmitter electrodes. The second sensing circuitry is used for determining an amount of interference from a second resulting signal that is obtained from the second transmitter electrode. The input device further includes a filtering circuitry coupled to the second sensing circuitry. The filtering circuitry removes a portion of the amount of interference from the first resulting signal.

In general, in one aspect, the invention relates to a processing system coupled with an input device. The processing system includes a sensor module that transmits a first sensing signal along a first transmitter electrode among various transmitter electrodes of the input device. The sensor module obtains, using a receiver electrode from various receiver electrodes in the input device, a first resulting signal in response to the first sensing signal being transmitted along the first transmitter electrode. The sensor module obtains a second resulting signal from a second transmitter electrode among the transmitter electrodes. The processing system further includes a determination module that determine, using the second resulting signal, an amount of interference along the second transmitter electrode. The determination module adjusts, using the amount of interference, the first resulting signal to produce an adjusted resulting signal. A portion of the amount of interference is removed from the adjusted resulting signal. The determination module determines, using the adjusted resulting signal, positional information regarding a location of an input object in a sensing region of the input device.

In general, in one aspect, the invention relates to a method of capacitive sensing that includes transmitting a first sensing signal along a first transmitter electrode among various transmitter electrodes of an input device. The method further includes obtaining, using various receiver electrodes in the input device, a first resulting signal in response to the first sensing signal being transmitted along the first transmitter electrode. The method further includes obtaining a second resulting signal from a second transmitter electrode among the transmitter electrodes. The method further includes determining, using the second resulting signal, interference along the second transmitter electrode. The method further includes adjusting, using the interference along the second transmitter electrode, the first resulting signal to produce an adjusted resulting signal. The method further includes determining, using the adjusted resulting signal, positional information regarding a location of an input object in a sensing region of the input device.

Other aspects of the disclosed technology will be apparent from the following description and the appended claims.

BRIEF DESCRIPTION OF DRAWINGS

FIG. 5 shows an example in accordance with one or more embodiments.

DETAILED DESCRIPTION

Figure 1:
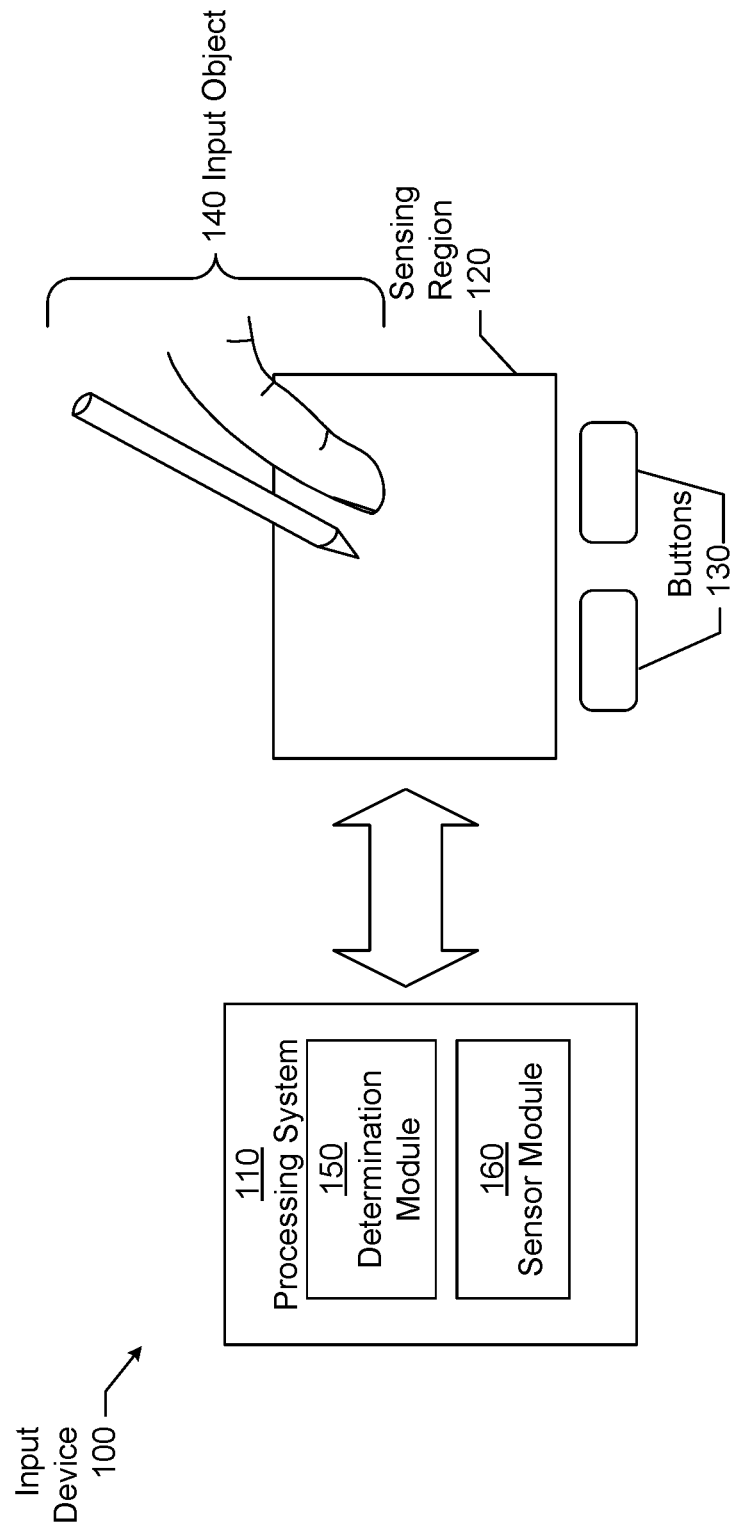
FIG. 1 shows a block diagram of an example system that includes an input device in accordance with one or more embodiments.

Specific embodiments of the disclosed technology will now be described in detail with reference to the accompanying figures. Like elements in the various figures may be denoted by like reference numerals and/or like names for consistency.

The following detailed description is merely exemplary in nature, and is not intended to limit the disclosed technology or the application and uses of the disclosed technology. Furthermore, there is no intention to be bound by any expressed or implied theory presented in the preceding technical field, background, brief summary or the following detailed description.

In the following detailed description of embodiments of the disclosed technology, numerous specific details are set forth in order to provide a more thorough understanding of the disclosed technology. However, it will be apparent to one of ordinary skill in the art that the disclosed technology may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Various embodiments of the present disclosed technology provide input devices and methods that facilitate improved usability. In particular, one or more embodiments of the disclosed technology are directed to providing a method of interference detection and/or cancellation using a transmitter electrode in place of receiver electrode. Specifically, interference may be measured along a transmitter electrode while a different transmitter electrode is being used for input object capacitive sensing. As such, sensing circuitry coupled to the transmitter electrode may obtain resulting signals in a similar manner as sensing circuitry connected to a receiver electrode. When an input device switches to a different transmitter electrode for capacitive sensing, the input device may also switch to a different transmitter electrode for monitoring interference.

Furthermore, various interference removal techniques may use the interference detected at a transmitter electrode. For example, filtering circuitry, such as scaling circuitry, may be coupled to a monitored transmitter electrode and used to reduce interference in the input device. Likewise, filtering circuitry may adjust a resulting signal obtained from a receiver electrode accordingly. In particular, interference measurements may be used for various noise filtering processes as well as modifying the frequency and/or amplitude that sensing signals are transmitted over transmitter electrodes for capacitive sensing and/or display updating.

Turning now to the figures, FIG. 1 is a block diagram of an exemplary input device (100), in accordance with embodiments of this disclosure The input device (100) may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device (100) and separate joysticks or key switches. Further example electronic systems include peripherals, such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device (100) may be implemented as a physical part of the electronic system, or may be physically separate from the electronic system. Further, portions of the input device (100) may be part of the electronic system. For example, all or part of the determination module may be implemented in the device driver of the electronic system. As appropriate, the input device (100) may communicate with parts of the electronic system using any one or more of the following: buses, networks, and other wired or wireless interconnections. Example communication protocols include I2C, SPI, PS/2, Universal Serial Bus (USB), Bluetooth®, RF, and IrDA protocols.

In FIG. 1, the input device (100) is shown as a proximity sensor device (also often referred to as a "touchpad" or a "touch sensor device") configured to sense input provided by one or more input objects (140) in a sensing region (120). Example input objects include fingers and styli, as shown in FIG. 1. Throughout the specification, the singular form of input object may be used. Although the singular form is used, multiple input objects may exist in the sensing region (120). Further, the particular input objects in the sensing region may change over the course of one or more gestures. To avoid unnecessarily complicating the description, the singular form of input object is used and refers to all of the above variations.

The sensing region (120) encompasses any space above, around, in and/or near the input device (100) in which the input device (100) is able to detect user input (e.g., user input provided by one or more input objects (140)). The sizes, shapes, and locations of particular sensing regions may vary widely from embodiment to embodiment.

In some embodiments, the sensing region (120) extends from a surface of the input device (100) in one or more directions into space until signal-to-noise ratios prevent sufficiently accurate object detection. The extension above the surface of the input device may be referred to as the above surface sensing region. The distance to which this sensing region (120) extends in a particular direction, in various embodiments, may be on the order of less than a millimeter, millimeters, centimeters, or more, and may vary significantly with the type of sensing technology used and the accuracy desired. Thus, some embodiments sense input that includes no contact with any surfaces of the input device (100), contact with an input surface (e.g., a touch surface) of the input device (100), contact with an input surface of the input device (100) coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region (120) has a rectangular shape when projected onto an input surface of the input device (100).

The input device (100) may utilize any combination of sensor components and sensing technologies to detect user input in the sensing region (120). The input device (100) may include one or more sensing elements for detecting user input. As several non-limiting examples, the input device (100) may use capacitive, elastive, resistive, inductive, magnetic, acoustic, ultrasonic, and/or optical techniques.

Some implementations are configured to provide images that span one, two, three, or higher-dimensional spaces. Some implementations are configured to provide projections of input along particular axes or planes. Further, some implementations may be configured to provide a combination of one or more images and one or more projections.

In some resistive implementations of the input device (100), a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device (100), one or more sensing elements pick up loop currents induced by a resonating coil or pair of coils. Some combination of the magnitude, phase, and frequency of the currents may then be used to determine positional information.

In some capacitive implementations of the input device (100), voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing electrodes to create electric fields. In some capacitive implementations, separate sensing electrodes may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects. The reference voltage may be a substantially constant voltage or a varying voltage, and in various embodiments, the reference voltage may be system ground. Measurements acquired using absolute capacitance sensing methods may be referred to as absolute capacitive measurements.

Some capacitive implementations utilize "mutual capacitance" (or "trans capacitance") sensing methods based on changes in the capacitive coupling between sensor electrodes. In various embodiments, an input object near the sensor electrodes alters the electric field between the sensor electrodes, thus changing the measured capacitive coupling. In one implementation, a mutual capacitance sensing method operates by detecting the capacitive coupling between one or more transmitter sensor electrodes (also "transmitter electrodes" or "transmitter") and one or more receiver sensor electrodes (also "receiver electrodes" or "receiver"). Transmitter signals may be electrically applied to transmitter electrodes. Receiver sensor electrodes may be held substantially constant relative to the reference voltage to facilitate receipt of resulting signals. The reference voltage may be a substantially constant voltage and, in various embodiments, the reference voltage may be system ground. The transmitter electrodes may be electrically driven with respect to the receiver electrodes to transmit transmitter signals and to facilitate receipt of resulting signals. A resulting signal may include effect(s) corresponding to one or more transmitter signals, and/or to one or more sources of environmental interference (e.g., other electromagnetic signals). The effect(s) may be the transmitter signal, a change in the transmitter signal caused by one or more input objects and/or environmental interference, or other such effects. Sensor electrodes may be dedicated transmitters or receivers, or may be configured to both transmit and receive. Measurements acquired using mutual capacitance sensing methods may be referred to as mutual capacitance measurements.

Further, the sensor electrodes may be of varying shapes and/or sizes. The same shapes and/or sizes of sensor electrodes may or may not be in the same groups. For example, in some embodiments, receiver electrodes may be of the same shapes and/or sizes while, in other embodiments, receiver electrodes may be varying shapes and/or sizes.

In FIG. 1, a processing system (110) is shown as part of the input device (100). The processing system (110) is configured to operate the hardware of the input device (100) to detect input in the sensing region (120). The processing system (110) includes parts of, or all of, one or more integrated circuits (ICs) and/or other circuitry components. For example, a processing system for a mutual capacitance sensor device may include transmitter circuitry configured to transmit signals with transmitter sensor electrodes, and/or receiver circuitry configured to receive signals with receiver sensor electrodes. Further, a processing system for an absolute capacitance sensor device may include driver circuitry configured to drive absolute capacitance signals onto sensor electrodes, and/or receiver circuitry configured to receive signals with those sensor electrodes. In one or more embodiments, a processing system for a combined mutual and absolute capacitance sensor device may include any combination of the above described mutual and absolute capacitance circuitry. In some embodiments, the processing system (110) also includes electronically-readable instructions, such as firmware code, software code, and/or the like. In some embodiments, components composing the processing system (110) are located together, such as near sensing element(s) of the input device (100). In other embodiments, components of processing system (110) are physically separate with one or more components close to the sensing element(s) of the input device (100), and one or more components elsewhere. For example, the input device (100) may be a peripheral coupled to a computing device, and the processing system (110) may include software configured to run on a central processing unit of the computing device and one or more ICs (perhaps with associated firmware) separate from the central processing unit. As another example, the input device (100) may be physically integrated in a mobile device, and the processing system (110) may include circuits and firmware that are part of a main processor of the mobile device. In some embodiments, the processing system (110) is dedicated to implementing the input device (100). In other embodiments, the processing system (110) also performs other functions, such as operating display screens, driving haptic actuators/mechanisms (not shown), etc.

The processing system (110) may be implemented as a set of modules that handle different functions of the processing system (110). Each module may include circuitry that is a part of the processing system (110), firmware, software, and/or a combination thereof. In various embodiments, different combinations of modules may be used. For example, as shown in FIG. 1, the processing system (110) may include a determination module (150) and a sensor module (160). The determination module (150) may include functionality to determine when at least one input object is in a sensing region, determine signal to noise ratio, determine positional information of an input object, identify a gesture, determine an action to perform based on the gesture, a combination of gestures or other information, and/or perform other operations.

The sensor module (160) may include functionality to drive the sensing elements to transmit transmitter signals and receive the resulting signals. For example, the sensor module (160) may include sensor circuitry that is coupled to the sensing elements. The sensor module (160) may include, for example, a transmitter module and a receiver module. The transmitter module may include transmitter circuitry that is coupled to a transmitting portion of the sensing elements. The receiver module may include receiver circuitry coupled to a receiving portion of the sensing elements and may include functionality to receive the resulting signals.

Alternative or additional modules may exist in accordance with one or more embodiments. Such alternative or additional modules may correspond to distinct modules or sub-modules of one or more of the modules discussed above. Example alternative or additional modules include hardware operation modules for operating hardware such as sensor electrodes and display screens, data processing modules for processing data such as sensor signals and positional information, reporting modules for reporting information, and identification modules configured to identify gestures, such as mode changing gestures, and mode changing modules for changing operation modes. Further, the various modules may be combined in separate integrated circuits. For example, a first module may be comprised at least partially within a first integrated circuit and a separate module may be comprised at least partially within a second integrated circuit. Further, portions of a single module may span multiple integrated circuits. In some embodiments, the processing system as a whole may perform the operations of the various modules.

For example, in some embodiments, the processing system (110) operates the sensing element(s) of the input device (100) to produce electrical signals indicative of input (or lack of input) in the sensing region (120). The processing system (110) may perform any appropriate amount of processing on the electrical signals in producing the information provided to the electronic system. For example, the processing system (110) may digitize analog electrical signals obtained from the sensor electrodes. As another example, the processing system (110) may perform filtering or other signal conditioning. As yet another example, the processing system (110) may subtract or otherwise account for a baseline, such that the information reflects a difference between the electrical signals and the baseline. As yet further examples, the processing system (110) may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device (100) includes a touch screen interface, and the sensing region (120) overlaps at least part of an active area of a display screen. For example, the input device (100) may include substantially transparent sensor electrodes overlaying the display screen and provide a touch screen interface for the associated electronic system. The display screen may be any type of dynamic display capable of displaying a visual interface to a user, and may include any type of light-emitting diode (LED), organic LED (OLED), cathode ray tube (CRT), liquid crystal display (LCD), plasma, electroluminescence (EL), or other display technology. The input device (100) and the display screen may share physical elements. For example, some embodiments may utilize some of the same electrical components for displaying and sensing. In various embodiments, one or more display electrodes of a display device may be configured for both display updating and input sensing. As another example, the display screen may be operated in part or in total by the processing system (110).

While FIG. 1 shows a configuration of components, other configurations may be used without departing from the scope of the disclosure. For example, various components may be combined to create a single component. As another example, the functionality performed by a single component may be performed by two or more components. Accordingly, for at least the above-recited reasons, embodiments of the disclosure should not be considered limited to the specific arrangements of components and/or elements shown in FIG. 1.

Figure 2:
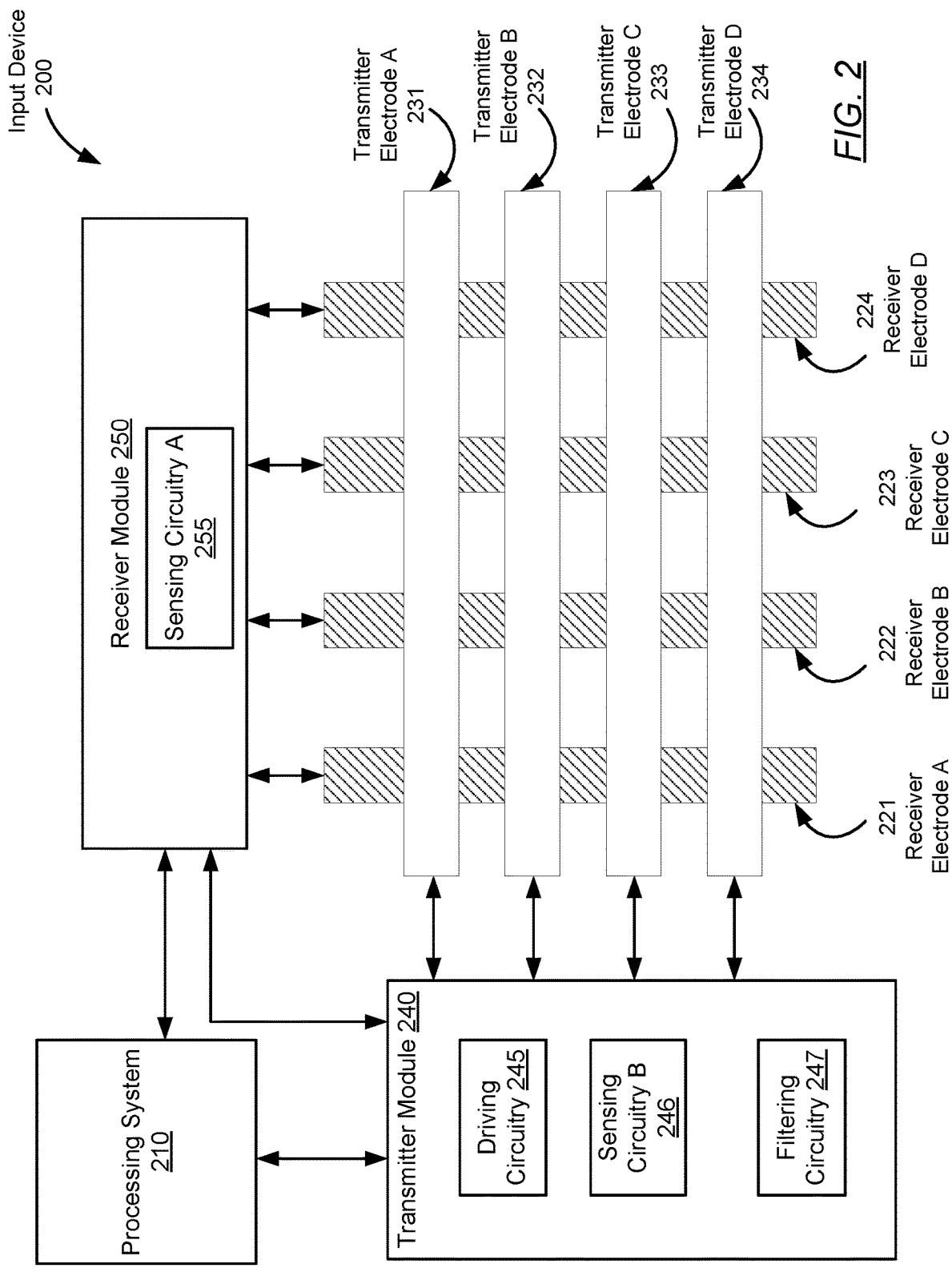
FIG. 2 shows a schematic view of an input device in accordance with one or more embodiments.

Turning to FIG. 2, FIG. 2 shows a schematic view of an input device (200) in accordance with one or more embodiments. As shown in FIG. 2, the input device (200) may include a receiver module (250), a transmitter module (240), and a processing system (210). The processing system (210) may be similar to processing system (110) described in FIG. 1 and the accompanying description. The transmitter module (240) may include driving circuitry (245) that may be similar to transmitter circuitry described in FIG. 1 and the accompanying description. For example, driving circuitry (245) may include hardware and/or software that includes functionality to generate one or more sensing signals transmitted over one or more transmitter electrodes (e.g., transmitter electrode A (231), transmitter electrode B (232), transmitter electrode C (233), transmitter electrode D (234)). The transmitter electrodes (231, 232, 233, 234) may be similar to the transmitter electrodes described in FIG. 1 and the accompanying description.

Moreover, the receiver module (250) may include sensing circuitry (e.g., sensing circuitry A (255)) that includes functionality for obtaining and/or analyzing resulting signals. For example, sensing circuitry may include hardware and/or software that includes functionality to obtain one or more resulting signals from one or more receiver electrodes (e.g., receiver electrode A (221), receiver electrode B (222), receiver electrode C (223), receiver electrode D (224)) in response to one or more sensing signals transmitted over the transmitter electrodes. The sensing circuitry A (255) may be similar to the receiver circuitry described in FIG. 1 and the accompanying description. In particular, the sensing circuitry A (255) may include analog-front ends, which may further include various analog conditioning circuitry, such as operational amplifiers, digital-signal processing components, filters, and various application-specific integrated circuits for detecting and analyzing resulting signals obtained from the receiver electrodes (221, 222, 223, 224). Likewise, the receiver electrodes (221, 222, 223, 224) may be similar to the receiver electrodes described in FIG. 1 and the accompanying description.

In one or more embodiments, a transmitter module includes sensing circuitry (e.g., sensing circuitry B (246)) that includes functionality to monitor a transmitter electrode while a different transmitter electrode transmitted one or more sensing signals. For example, sensing circuitry B (246) may be similar to sensing circuitry A (255) that is described above with respect to the receiver module (250). However, in place of detecting changes in capacitance with respect to an input object, the sensing circuitry B (246) may detect background and/or input object coupled interference in the input device (200). A transmitter module may also include filtering circuitry (e.g., filtering circuitry (247)) that may be hardware and/or software that includes functionality to remove a portion of the interference detected by sensing circuitry B (246). In particular, one or more resulting signals obtained by sensing circuitry B (246) may be processed by the filtering circuitry (247). In one or more embodiments, for example, the filtering circuitry (247) may report an amount of interference to the processing system (210) for further noise removal processing and/or adjustments to the transmission of one or more sensing signals. Likewise, the filtering circuitry (247) may include functionality to communicate the interference directly to one or more components on the receiver module (250).

Figure 3:
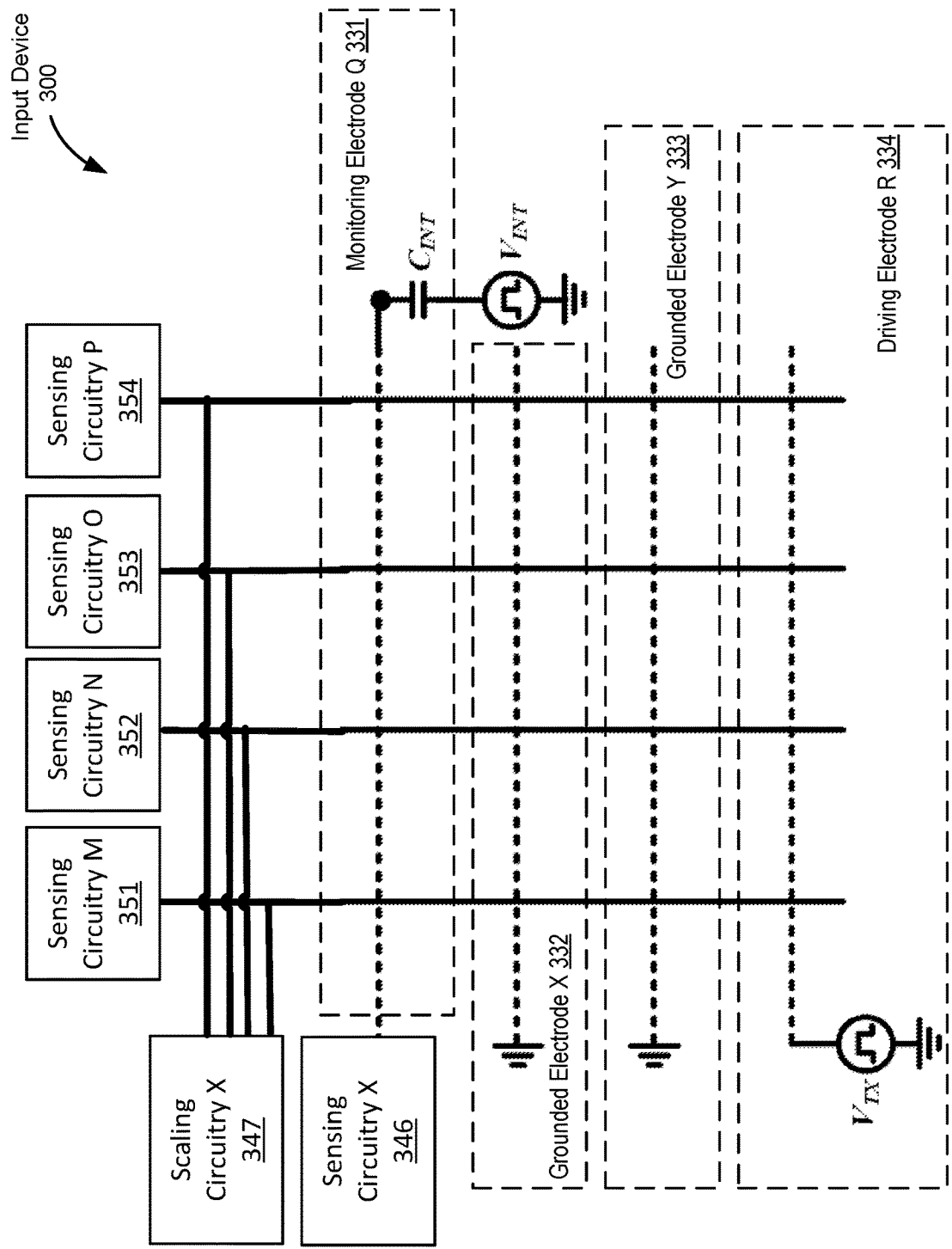
FIG. 3 shows a schematic view of an input device in accordance with one or more embodiments.

Turning to FIG. 3, FIG. 3 show a schematic of an input device (300). As shown in FIG. 3, the input device (300) may include various sensing circuitries (e.g., sensing circuitry M (351), sensing circuitry N (352), sensing circuitry O (353), sensing circuitry P (354)) coupled to various receiver electrodes (not shown). The sensing circuitries (351, 352, 353, 354) may be similar to sensing circuitry (246, 255) described in FIG. 2 and the accompanying description. The input device (300) may further include one or more driving electrodes (e.g., driving electrode R (334)). A driving electrode may be a transmitter electrode where one or more sensing signals, e.g., VTx, are transmitted during a particular scanning period of a capacitive sensing frame sequence. As such, the driving electrode may alternate to a different transmitter electrode through the capacitive sensing frame sequence.

Likewise, the input device (300) may further include one or more monitoring electrodes (e.g., monitoring electrode Q (331)). Specifically, a monitoring electrode may be a transmitter electrode that includes functionality for measuring interference. As shown in FIG. 3, for example, interference may be represented as a voltage source VINT coupled to a capacitor CINT that produces an interfering electrical charge in the monitoring electrode Q (331). Thus, the monitoring electrode Q (331) may detect the capacitance of CINT using the sensing circuitry X (346).

In one or more embodiments, for example, a particular scanning period of a capacitive sensing frame sequence includes one driving electrode and one monitoring electrode. For example, the driving electrode R (334) may perform capacitive sensing of a sensing region of the input device (300). On the other hand, the monitoring electrode Q (331) may determine background interference and/or object-coupled interference in the input device (300). Background interference may include noise caused by various electrical and/or mechanical operations of the input device (300), such as interference caused by electronics on a host device. Input-object coupled interference may include noise caused by the closed proximity of one or more input objects to the input device (300). For more information regarding capacitive sensing frame sequences, see FIG. 5 and the accompanying description.

Keeping with FIG. 3, sensing circuitry X (346) coupled to the monitoring electrode Q (331) may include functionality to determine an amount of interference detected along monitoring electrode Q (331) while one or more sensing signals are transmitted along driving electrode R (334). Likewise, the transmitter electrodes not currently driving electrodes or monitoring electrodes, e.g., grounded electrode X (332), grounded electrode Y (333), may be set to a reference voltage until the input device (300) selects the grounded electrode to be a driving electrode or a monitoring electrode.

In one or more embodiments, the input device (300) includes scaling circuitry (e.g., scaling circuitry X (347)) that includes functionality for using interference to adjust one or more resulting signals obtained from one or more receiver electrodes. For example, scaling circuitry X (347) may convert an interference signal obtained from a monitoring electrode Q (331) into a cancellation signal at a respective receiver electrode for sensing circuitry (351, 352, 353, 354).

In another embodiment, if interference is destructive interference, scaling circuitry X (347) may positively scale an interference signal, e.g., a resulting signal from monitoring electrode Q (331), to produce a cancellation signal. The cancellation signal may thus increase an amplitude of a resulting signal to remove the interference. In other words, positively scaling may return a resulting signal obtained at a receiver electrode to a waveform that includes approximately none of the interference detected at the monitoring electrode Q (331).

In a further embodiment, if interference is constructive interference, scaling circuitry X (347) may decrease the amplitude of a resulting signal from a receiver electrode to remove an interference component. Thus, the linearity performance of a receiver module may be increased under large-interfering conditions through use of various cancellation signals for constructive and/or destructive interference measured at a monitoring electrode.

In some embodiments, for example, an input device may include sensor electrodes that are disposed in a matrix electrode array (also called an "Advanced Matrix Pad") where each sensor electrode may be referred to as a matrix sensor electrode. As such, a transmitter electrode in a matrix electrode array may be a driving electrode and/or a monitoring electrode. Further, two or more sensor electrodes of the matrix electrode array may correspond to a sensor pixel of a capacitive image. As such, sensor pixels may be arranged in a grid and/or a non-grid manner within an input device.

Figure 4:
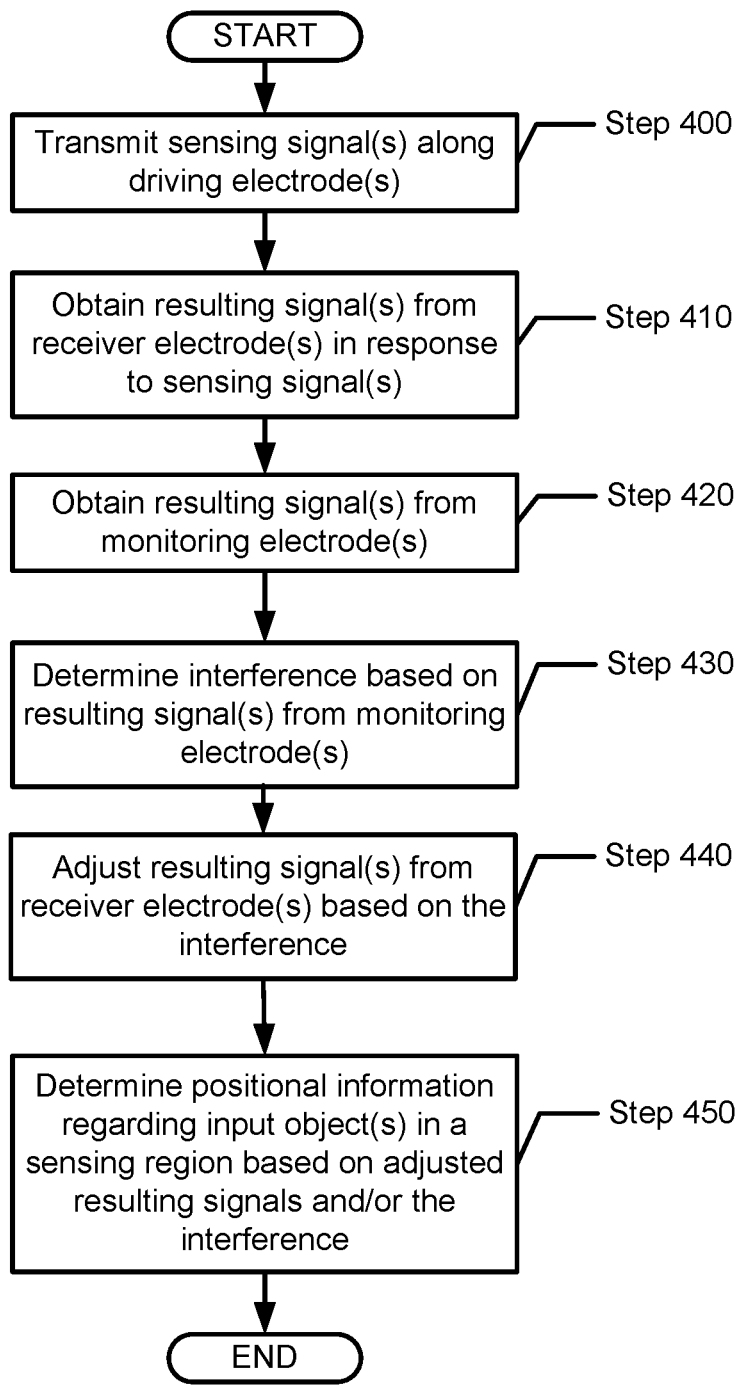
FIG. 4 shows a flowchart in accordance with one or more embodiments.

Turning to FIG. 4, FIG. 4 shows a flowchart in accordance with one or more embodiments. Specifically, FIG. 4 describes a method for capacitive sensing and/or detecting interference. The process shown in FIG. 4 may involve, for example, one or more components discussed above in reference to FIGS. 1, 2, and 3 (e.g., processing system (110)). While the various steps in FIG. 4 are presented and described sequentially, one of ordinary skill in the art will appreciate that some or all of the steps may be executed in different orders, may be combined or omitted, and some or all of the steps may be executed in parallel. Furthermore, the steps may be performed actively or passively.

In Step 400, one or more sensing signals are transmitted along one or more driving electrodes in accordance with one or more embodiments. For example, the driving electrodes may be similar to the transmitter electrodes described in FIGS. 1 and 2 and the accompanying description and/or the driving electrodes described in FIG. 3 and the accompanying description. Moreover, the one or more sensing signals may be transmitter signals as described in FIG. 1 and the accompanying description.

In Step 410, one or more resulting signals are obtained from one or more receiver electrodes in response to one or more sensing signals in accordance with one or more embodiments. In particular, a resulting signal may correspond to a change in variable capacitance between a driving electrode and a receiver electrode and/or the receiver electrode and one or more input objects. For example, the resulting signal may be similar to the resulting signals described in FIG. 1 and the accompanying description.

In Step 420, one or more resulting signals are obtained from one or more monitoring electrodes in accordance with one or more embodiments. For example, sensing circuitry, such as an analog-front end, may be coupled to one or more transmitter electrodes. Likewise, a processing system in an input device may designate a particular transmitter electrode as a monitoring electrode. At substantially the same time in a capacitive sensing frame sequence and/or at a different time during the sequence, one or more resulting signals may be analyzed for various types of interference. For example, sensing circuitry and/or filtering circuitry may detect an amount of interference based on a resulting signal from a monitoring electrode.

In one or more embodiments, a monitoring electrode is an idle transmitter electrode during a code division multiplexing scan of a sensing region. For example, by leaving at least one transmitter electrode idle, interference may be measured throughout the entire capacitive scan of a code division multiplexing matrix of an input device. Moreover, sensing circuitry coupled to a monitoring electrode may have a different demodulation frequency than the sensing circuitry coupled to one or more receiver electrodes. Thus, the monitoring electrodes may provide interference measurements during a code division multiplexing scan that describe a sensing signal spectrum of the code division multiplexing scan.

In Step 430, interference is determined from one or more resulting signals from one or more monitoring electrodes in accordance with one or more embodiments. For example, a scalar amount of interference may be measured by sensing circuitry in a transmitter module. As such, the amount of detected interference may be used for adjusting sensing signal waveforms, sensing signal transmission frequencies, and/or amplifier gains for resulting signals obtained by receiver electrodes. Likewise, interference detected in a resulting signal may be digitized via an analog-to-digital converter (ADC). For example, a digital signal of the interference may be generated for further processing using various noise-removal techniques in a processing system and/or a receiver module.

In one or more embodiment, for example, detecting interference using transmitter electrodes eliminates the need for noise bursts in a capacitive sensing frame sequence. Avoiding noise bursts may allow more frame time in the sequence to be designated for scanning a sensing region for an input object. In particular, noise bursts may produce a time penalty associated with performing capacitive proximity sensing in conjunction with interference sensing. Moreover, interference-detection techniques with transmitter electrodes may allow independent access to interference information without the use of a receiver electrode. Likewise, such interference-detection techniques may also eliminate problems associated with differential sensing, such as potentially decreasing the received signal from a capacitive scan because a finger is single-ended in nature.

In Step 440, one or more resulting signals from one or more receiver electrodes are adjusted based on interference in accordance with one or more embodiments. For example, a processing system may use the interference detected at a monitoring electrode to adjust resulting signals from an absolute capacitive scan and/or a transcapacitive scan of a sensing region. In one example, the adjustment may be performed using digital processing to adjust a change in capacitance for a particular capacitive measurement. Likewise, the interference may be provided as an input to one or more filtering and/or noise removal processes performed on an analog and/or digitized resulting signal from a receiver electrode.

In Step 450, positional information is determined regarding one or more input objects based on one or more adjusted resulting signals and/or interference in accordance with one or more embodiments. For example, the positional information may be similar to the positional information described in FIG. 1 and the accompanying description. Accordingly, a processing system may determine positional information using capacitance values obtained regarding one or more adjusted resulting signals. In particular, adjusted resulting signals may be the resulting signals obtained in Step 440 above. Likewise, a processing system may use non-adjusted resulting signals to obtain positional information and then modify the positional information based on the amount of interference detected at a monitoring electrode. For example, a processing system may use a look-up table to match positional information with adjusted positional information based on a specific amount of interference.

Turning to FIG. 5, FIG. 5 provides an example of a capacitive sensing frame sequence. The following example is for explanatory purposes only and not intended to limit the scope of the disclosed technology.

Turning to FIG. 5, a capacitive sensing frame sequence is shown that includes various scanning intervals (i.e., scanning interval A (510), scanning interval B (520), scanning interval C (530), scanning interval D (540)) separated by various reset intervals (i.e., reset interval W (515), reset interval X (525), reset interval Y (535), reset interval Z (545)). When a reset interval occurs in the capacitive sensing frame sequence, a different transmitter electrode may be selected for transmitting one or more sensing signals for capacitive sensing. Likewise, the monitoring electrode at the particular scanning interval may also be switched to a different transmitter electrode for interference detection. While monitoring electrodes are shown operating in the scanning intervals (510, 520, 530, 540) in FIG. 5, the monitoring electrodes may also measure interference in the reset intervals (515, 525, 535, 545) and/or during a time period overlapping multiple scanning intervals.

Keeping with FIG. 5, in scanning interval A (510), transmitter electrode E (531) is designated as the driving electrode for capacitive sensing, while transmitter electrode G (533) is designated as the monitoring electrode for measuring interference in an input device (not shown). After reset interval W (515), receiver electrodes (not shown) in the input device may have time to settle and the driving electrode is switched transmitter electrode F (532). Likewise, the monitoring electrode is switched to transmitter electrode H (534). For scanning interval C (530), the transmitter electrode G (533) is now the driving electrode and the transmitter electrode E (531) is now the monitoring electrode. For scanning interval D (540), the transmitter electrode H (534)

is now the driving electrode and the transmitter electrode F (532) is now the monitoring electrode. Accordingly, an input device may repeat the capacitive sensing frame sequence shown in FIG. 5 and return to scanning interval A (510), and/or switch to a different capacitive sensing frame sequence.

While FIG. 5 is directed to a capacitive sensing frame sequence for a non-display input device, interference detection and removal techniques may also be directed to capacitive sensing frame sequences that include common electrodes for updating a display device. For example, a common electrode may perform capacitive sensing and display updates, while also being switched to a monitoring electrode for a portion of the respective frame sequence.

Figure 6:
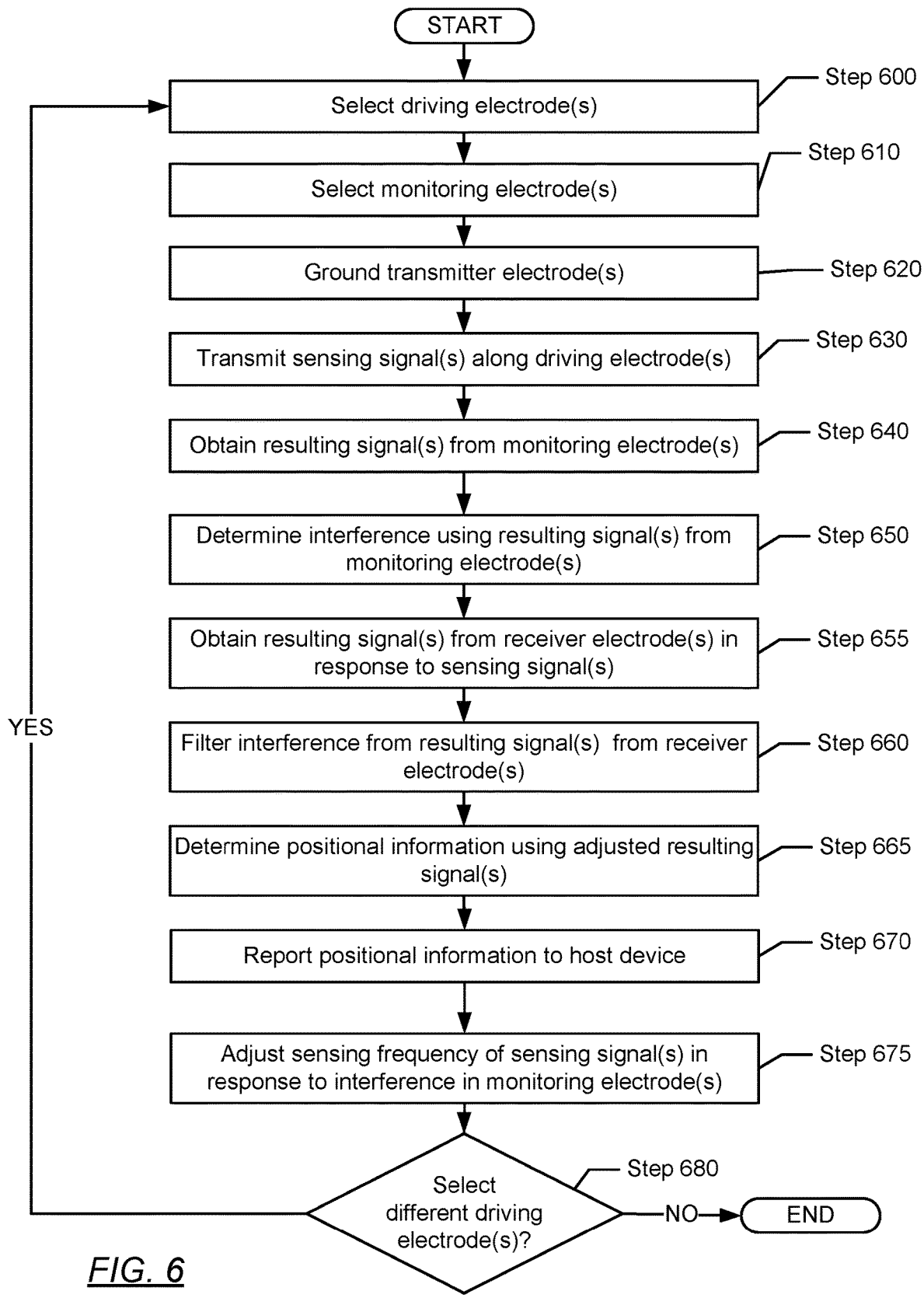
FIG. 6 shows a flowchart in accordance with one or more embodiments.

Turning to FIG. 6, FIG. 6 shows a flowchart in accordance with one or more embodiments. Specifically, FIG. 6 describes a method for capacitive sensing and/or detecting interference. The process shown in FIG. 6 may involve, for example, one or more components discussed above in reference to FIGS. 1, 2, and 3 (e.g., processing system (110)). While the various steps in FIG. 6 are presented and described sequentially, one of ordinary skill in the art will appreciate that some or all of the steps may be executed in different orders, may be combined or omitted, and some or all of the steps may be executed in parallel. Furthermore, the steps may be performed actively or passively.

In Step 600, one or more driving electrodes are selected in accordance with one or more embodiments. For example, a processing system and/or transmitter module may iteratively select one or more driving electrodes to obtain a capacitive response for a portion of a sensing region of an input device. For a code division multiplexing (CDM) scan, the driving electrodes may be selected for application of two or more distinct modulation signals. For example, a driving electrode may be selected based on a particular digital code of a CDM sequence that produces a respective frequency-domain image of a sensing region.

In Step 610, one or more monitoring electrodes are selected in accordance with one or more embodiments. Based on which transmitter electrodes are selected for the driving electrodes in Step 600, for example, one or more of the remaining transmitter electrodes may selected as monitoring electrodes. For example, a processing system and/or transmitter module may designate a default monitoring electrode for a particular set of driving electrodes. In another embodiment, the processing system may seek to analyze a particular type of interference within an input device and select a set of monitoring electrodes to capture the specific type of interference. For example, if a processing system is trying to measure input-object coupled interference, the processing system may use positional information regarding an input object to select transmitter electrodes located near the input object. If the processing system is analyzing background noise, monitoring electrodes may use positional information to select transmitter electrodes located away from the input object.

In one or more embodiments, multiple monitoring electrodes are selected for measuring interference. For example, multiple transmitter electrodes may be ganged together using the same sensing circuitry and/or filtering circuitry. Likewise, separate sensing circuitry and/or filtering circuitry may be employed for each monitoring electrode in an input device.

In Step 620, one or more transmitter electrodes are grounded in accordance with one or more embodiments. When a transmitter electrode is neither selected to be a driving electrode or a monitoring electrode, the transmitter electrode may be set to a reference voltage, such as a system ground. By grounding a transmitter electrode, for example, the grounded electrode may be prepared to be a future driving electrode or future monitoring electrode during a later period of a capacitive sensing frame sequence. Likewise, grounding a transmitter electrode may prevent the transmitter electrode from contributing interference to a monitoring electrode.

In Step 630, one or more sensing signals are transmitted along one or more driving electrodes in accordance with one or more embodiments. For example, Step 630 may be similar to Step 400 that is described above in FIG. 4 and the accompanying description.

In Step 640, one or more resulting signals are obtained from one or more monitoring electrodes in accordance with one or more embodiments. For example, Step 640 may be similar to Step 420 that is described above in FIG. 4 and the accompanying description.

In Step 650, interference is determined using one or more resulting signals from one or more monitoring electrodes in accordance with one or more embodiments. For example, Step 650 may be similar to Step 430 that is described above in FIG. 4 and the accompanying description.

In Step 655, one or more resulting signals is obtained from one or more receiver electrodes in accordance with one or more embodiments. For example, Step 655 may be similar to Step 410 described above in FIG. 4 and the accompanying description.

In Step 660, interference is filtered from one or more resulting signals from one or more receiver electrodes in accordance with one or more embodiments. In one or more embodiments, for example, an input device includes scaling circuitry coupled to a transmitter module and/or a receiver module applies a cancellation signal to a resulting signal. Likewise, one or more digital signal processing filtering techniques may be performed on resulting signals at a processing system to determine an adjusted resulting signal and/or an adjusted capacitive measurement obtained from a resulting signal.

In Step 665, positional information is determined using one or more adjusted resulting signals in accordance with one or more embodiments. For example, Step 665 may be similar to Step 450 described above in FIG. 4 and the accompanying description.

In Step 670, positional information is reported to a host device in accordance with one or more embodiments. Different positional information for one or more input objects may trigger different types of interface actions, for example. For example, an interface action may be performed in response to specific gesture motion, such as two fingers moving away or towards each other. In another example, a lookup table may designate various interface actions based on a specific location of an input object in a sensing region. Interface actions may include a content manipulation action by a user with respect to text as well as pictures, data objects, and various types of data files that are used by a computing device. Examples of content manipulation actions may include copying, moving, dragging, and cutting the content from one location within the graphical user interface. Interface actions may also include window manipulation actions with respect to one or more GUI windows disposed in the graphical user interface. For example, a window manipulation action may maximize, minimize, and/or align a particular GUI window.

In Step 675, a sensing frequency is adjusted for one or more sensing signals in response to interference in one or more monitoring electrodes in accordance with one or more embodiments. For example, if detected interference is located within a specific frequency band, then a processing system may change the sensing frequency that one or more sensing signals are transmitted in Step 630. In particular, different sensing frequencies may perform capacitive sensing better or worse depending on the amount of interference in an input device.

In Step 680, a determination is made whether to select one or more different driving electrodes in accordance with one or more embodiments. For example, an input device may determine whether the end of a capacitive sensing frame sequence is reached. On the other hand, the input device may switch to a capacitive sensing mode, such as a sleep mode, where interference detection and/or capacitive sensing is no longer desired. When a determination is made that a different transmitter electrode is desired for the driving electrode, the process may proceed to Step 600. When a determination is made that no further interference sensing is desired, the process may end.

Figure 7:
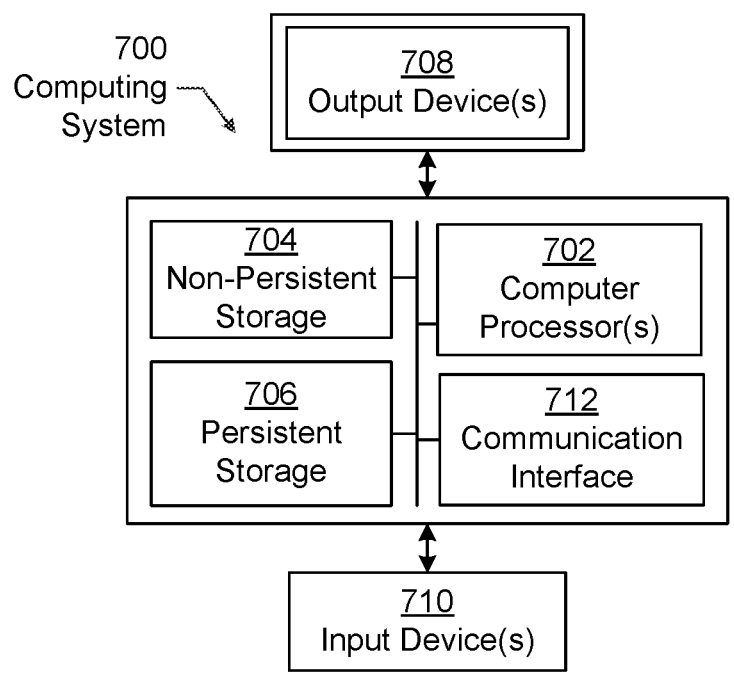
FIG. 7 shows a computing system in accordance with one or more embodiments.

Embodiments may be implemented on a computing system. Any combination of mobile, desktop, server, router, switch, embedded device, or other types of hardware may be used. For example, as shown in FIG. 7, the computing system (700) may include one or more computer processors (702), non-persistent storage (704) (e.g., volatile memory, such as random access memory (RAM), cache memory), persistent storage (706) (e.g., a hard disk, an optical drive such as a compact disk (CD) drive or digital versatile disk (DVD) drive, a flash memory, etc.), a communication interface (712) (e.g., Bluetooth interface, infrared interface, network interface, optical interface, etc.), and numerous other elements and functionalities.

The computer processor(s) (702) may be an integrated circuit for processing instructions. For example, the computer processor(s) may be one or more cores or micro-cores of a processor. The computing system (700) may also include one or more input devices (710), such as a touchscreen, keyboard, mouse, microphone, touchpad, electronic pen, or any other type of input device.

The communication interface (712) may include an integrated circuit for connecting the computing system (700) to a network (not shown) (e.g., a local area network (LAN), a wide area network (WAN) such as the Internet, mobile network, or any other type of network) and/or to another device, such as another computing device.

Further, the computing system (700) may include one or more output devices (708), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (702), non-persistent storage (704), and persistent storage (706). Many different types of computing systems exist, and the aforementioned input and output device(s) may take other forms.

Software instructions in the form of computer readable program code to perform embodiments of the disclosed technology may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the disclosed technology.

Shared memory refers to the allocation of virtual memory space in order to substantiate a mechanism for which data may be communicated and/or accessed by multiple processes. In implementing shared memory, an initializing process first creates a shareable segment in persistent or non-persistent storage. Post creation, the initializing process then mounts the shareable segment, subsequently mapping the shareable segment into the address space associated with the initializing process. Following the mounting, the initializing process proceeds to identify and grant access permission to one or more authorized processes that may also write and read data to and from the shareable segment. Changes made to the data in the shareable segment by one process may immediately affect other processes, which are also linked to the shareable segment. Further, when one of the authorized processes accesses the shareable segment, the shareable segment maps to the address space of that authorized process. Often, only one authorized process may mount the shareable segment, other than the initializing process, at any given time.

Other techniques may be used to share data, such as the various data described in the present application, between processes without departing from the scope of the disclosed technology. The processes may be part of the same or different application and may execute on the same or different computing system.

Rather than or in addition to sharing data between processes, the computing system performing one or more embodiments of the disclosed technology may include functionality to receive data from a user. For example, in one or more embodiments, a user may submit data via a graphical user interface (GUI) on the user device. Data may be submitted via the graphical user interface by a user selecting one or more graphical user interface widgets or inserting text and other data into graphical user interface widgets using a touchpad, a keyboard, a mouse, or any other input device. In response to selecting a particular item, information regarding the particular item may be obtained from persistent or non-persistent storage by the computer processor. Upon selection of the item by the user, the contents of the obtained data regarding the particular item may be displayed on the user device in response to the user's selection.

By way of another example, a request to obtain data regarding the particular item may be sent to a server operatively connected to the user device through a network. For example, the user may select a uniform resource locator (URL) link within a web client of the user device, thereby initiating a Hypertext Transfer Protocol (HTTP) or other protocol request being sent to the network host associated with the URL. In response to the request, the server may extract the data regarding the particular selected item and send the data to the device that initiated the request. Once the user device has received the data regarding the particular item, the contents of the received data regarding the particular item may be displayed on the user device in response to the user's selection. Further to the above example, the data received from the server after selecting the URL link may provide a web page in Hyper Text Markup Language (HTML) that may be rendered by the web client and displayed on the user device.

Once data is obtained, such as by using techniques described above or from storage, the computing system, in performing one or more embodiments of the disclosed technology, may extract one or more data items from the obtained data. For example, the extraction may be performed as follows by the computing system (700) in FIG. 7. First, the organizing pattern (e.g., grammar, schema, layout) of the data is determined, which may be based on one or more of the following: position (e.g., bit or column position, $N_{th}$ token in a data stream, etc.), attribute (where the attribute is associated with one or more values), or a hierarchical/tree structure (consisting of layers of nodes at different levels of detail—such as in nested packet headers or nested document sections). Then, the raw, unprocessed stream of data symbols is parsed, in the context of the organizing pattern, into a stream (or layered structure) of tokens (where each token may have an associated token "type").

Next, extraction criteria are used to extract one or more data items from the token stream or structure, where the extraction criteria are processed according to the organizing pattern to extract one or more tokens (or nodes from a layered structure). For position-based data, the token(s) at the position(s) identified by the extraction criteria are extracted. For attribute/value-based data, the token(s) and/or node(s) associated with the attribute(s) satisfying the extraction criteria are extracted. For hierarchical/layered data, the token(s) associated with the node(s) matching the extraction criteria are extracted. The extraction criteria may be as simple as an identifier string or may be a query presented to a structured data repository (where the data repository may be organized according to a database schema or data format, such as XML).

The extracted data may be used for further processing by the computing system. For example, the computing system of FIG. 7, while performing one or more embodiments of the disclosed technology, may perform data comparison. Data comparison may be used to compare two or more data values (e.g., A, B). For example, one or more embodiments may determine whether A>B, A=B, A !=B, A<B, etc. The comparison may be performed by submitting A, B, and an opcode specifying an operation related to the comparison into an arithmetic logic unit (ALU) (i.e., circuitry that performs arithmetic and/or bitwise logical operations on the two data values). The ALU outputs the numerical result of the operation and/or one or more status flags related to the numerical result. For example, the status flags may indicate whether the numerical result is a positive number, a negative number, zero, etc. By selecting the proper opcode and then reading the numerical results and/or status flags, the comparison may be executed. For example, in order to determine if A>B, B may be subtracted from A (i.e., A−B), and the status flags may be read to determine if the result is positive (i.e., if A>B, then A−B>0). In one or more embodiments, B may be considered a threshold, and A is deemed to satisfy the threshold if A=B or if A>B, as determined using the ALU. In one or more embodiments of the disclosed technology, A and B may be vectors, and comparing A with B requires comparing the first element of vector A with the first element of vector B, the second element of vector A with the second element of vector B, etc. In one or more embodiments, if A and B are strings, the binary values of the strings may be compared.

The computing system in FIG. 7 may implement and/or be connected to a data repository. For example, one type of data repository is a database. A database is a collection of information configured for ease of data retrieval, modification, re-organization, and deletion. Database Management System (DBMS) is a software application that provides an interface for users to define, create, query, update, or administer databases.

The computing system of FIG. 7 may include functionality to present raw and/or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, e.g., by obtaining data from a data attribute within the data object that identifies the data object type. Then, the GUI may determine any rules designated for displaying that data object type, e.g., rules specified by a software framework for a data object class or according to any local parameters defined by the GUI for presenting that data object type. Finally, the GUI may obtain data values from the particular data object and render a visual representation of the data values within a display device according to the designated rules for that data object type.

Data may also be presented through various audio methods. In particular, data may be rendered into an audio format and presented as sound through one or more speakers operably connected to a computing device.

Data may also be presented to a user through haptic methods. For example, haptic methods may include vibrations or other physical signals generated by the computing system. For example, data may be presented to a user using a vibration generated by a handheld computer device with a predefined duration and intensity of the vibration to communicate the data.

The above description of functions present only a few examples of functions performed by the computing system of FIG. 7. Other functions may be performed using one or more embodiments of the disclosed technology.

While the disclosed technology has been described with respect to a limited number of embodiments, those skilled in the art, having benefit of this disclosure, will appreciate that other embodiments can be devised which do not depart from the scope of the disclosed technology as disclosed herein. Accordingly, the scope of the disclosed technology should be limited only by the attached claims.

What is claimed is:

1. An input device comprising:
   a plurality of transmitter electrodes coupled to driving circuitry, wherein the driving circuitry is configured to transmit one or more sensing signals along a first transmitter electrode among the plurality of transmitter electrodes;
   a receiver electrode coupled to a first sensing circuitry, wherein the first sensing circuitry is configured to obtain a first resulting signal from the receiver electrode in response to transmitting the one or more sensing signals along the first transmitter electrode among the plurality of transmitter electrodes, wherein the first resulting signal from the receiving electrode is configured for determining positional information regarding an input object located in a sensing region of the input device;

a second sensing circuitry coupled to a second transmitter electrode different from the first transmitter electrode among the plurality of transmitter electrodes,
  wherein the second sensing circuitry is configured for determining an amount of interference based on a second resulting signal that is obtained from the second transmitter electrode, and
  wherein the second resulting signal used for determining the amount of interference is obtained from the second transmitter electrode while the one or more sensing signals are transmitted along the first transmitter electrode; and a filtering circuitry coupled to the second sensing circuitry, wherein the filtering circuitry is configured for removing a portion of the amount of interference from the first resulting signal.

2. The input device of claim 1,
wherein the filtering circuitry comprises scaling circuitry, and
wherein the scaling circuitry is configured to adjust an amplitude of the first resulting signal based on the amount of interference to remove the portion of the amount of interference that is determined using the second transmitter electrode.

3. The input device of claim 1, further comprising:
a processing system coupled to the first sensing circuitry and the second sensing circuitry,
wherein the processing system is configured to determine the amount of interference on the second transmitter electrode, and
wherein the processing system is further configured to adjust a sensing frequency that a plurality of sensing signals are transmitted along the plurality of transmitter electrodes based at least in part on the amount of interference on the second transmitter electrode.

4. The input device of claim 1,
wherein the second sensing circuitry is configured to determine the interference on the second transmitter electrode at substantially the same time that the one or more sensing signals are transmitted along the first transmitter electrode.

5. The input device of claim 1,
wherein the plurality of transmitter electrodes comprise a third transmitter electrode that is configured to be set to a reference voltage while the second sensing circuitry measures the amount of interference on the second transmitter electrode.

6. The input device of claim 1,
wherein the first resulting signal corresponds to a change in variable capacitance between the input object in a sensing region and the one or more sensing signals.

7. A processing system coupled with an input device, comprising:
a sensor module, the sensor module configured to:
  transmit a first sensing signal along a first transmitter electrode among a plurality of transmitter electrodes of the input device,
  obtain, using a receiver electrode from a plurality of receiver electrodes in the input device, a first resulting signal in response to the first sensing signal being transmitted along the first transmitter electrode among the plurality of transmitter electrodes, and
  obtain a second resulting signal from a second transmitter electrode different from the first transmitter electrode among the plurality of transmitter electrodes while the first sensing signal is transmitted along the first transmitter electrode; and a determination module, the determination module configured to:
  determine, using the second resulting signal, an amount of interference along the second transmitter electrode,
  adjust, using the amount of interference, the first resulting signal to produce an adjusted resulting signal, wherein a portion of the amount of interference is removed from the adjusted resulting signal, and
  determine, using the adjusted resulting signal, positional information regarding a location of an input object in a sensing region of the input device.

8. The processing system of claim 7, wherein the sensor module is further configured to:
select, among the plurality of transmitter electrodes of the input device, a third transmitter electrode for transmitting a second sensing signal;
select, among the plurality of transmitter electrodes of the input device, a fourth transmitter electrode for determining interference;
transmit the second sensing signal along the third transmitter electrode; and
determine interference along the fourth transmitter electrode.

9. The processing system of claim 7, wherein the determination module is further configured to:
determine that the amount of interference is constructive interference,
wherein adjusting the first resulting signal comprises decreasing the first resulting signal in response to determining that the amount of interference is constructive interference.

10. The processing system of claim 8, wherein the third transmitter electrode is selected according to a code division multiplexing scan of a sensing region of the input device, and wherein the fourth transmitter electrode determines interference over a sensing signal spectrum that is produced by the code division multiplexing scan of the sensing region.

11. The processing system of claim 7, wherein the determination module is further configured to:
generate a digital signal of an interference signal that is obtained from a monitoring electrode among the plurality of transmitter electrodes;
determine second positional information using a fourth resulting signal that is obtained from a receiver electrode among the plurality of receiver electrodes; and
adjust the second positional information using the digital signal of the interference signal to produce adjusted positional information.

12. The processing system of claim 7, wherein the determination module is further configured to:
report the positional information to a host device, wherein the positional information triggers an interface action in a graphical user interface operating on the host device.

13. The processing system of claim 7, wherein the determination module is further configured to:
determine, using the interference determined in the second transmitter electrode, an amount of interference in the plurality of resulting signals;
determine, using the amount of interference, a sensing frequency of a plurality of sensing signals; and wherein the sensor module is further configured to:
  transmit, at the sensing frequency, a plurality of sensing signals over the plurality of transmitter electrodes of the input device.

14. A method of capacitive sensing, comprising:
  transmitting a first sensing signal along a first transmitter electrode among a plurality of transmitter electrodes of an input device;
  obtaining, using a plurality of receiver electrodes in the input device, a first resulting signal in response to the first sensing signal being transmitted along the first transmitter electrode among the plurality of transmitter electrodes;
  obtaining a second resulting signal from a second transmitter electrode different from the first transmitter electrode among the plurality of transmitter electrodes while the first sensing signal is transmitted along the first transmitter electrode;
  determining, using the second resulting signal, interference along the second transmitter electrode;
  adjusting, using the interference along the second transmitter electrode, the first resulting signal to produce an adjusted resulting signal; and
  determining, using the adjusted resulting signal, positional information regarding a location of an input object in a sensing region of the input device.

15. The method of claim 14, further comprising:
  selecting, among the plurality of transmitter electrodes of the input device, a third transmitter electrode for transmitting a second sensing signal;
  selecting, among the plurality of transmitter electrodes of the input device, a fourth transmitter electrode for determining interference;
  transmitting the second sensing signal along the third transmitter electrode; and
  determining interference along the fourth transmitter electrode.

16. The method of claim 15, wherein the third transmitter electrode is selected according to a code division multiplexing scan of a sensing region of the input device, and wherein the fourth transmitter electrode determines interference over a sensing signal spectrum that is produced by the code division multiplexing scan of the sensing region.

17. The method of claim 14, further comprising:
  determining that the amount of interference is constructive interference,
  wherein adjusting the first resulting signal comprises decreasing the first resulting signal in response to determining that the amount of interference is constructive interference.

18. The method of claim 14,
  generating a digital signal of an interference signal that is obtained from a monitoring electrode among the plurality of transmitter electrodes;
  determining second positional information based at least in part on a fourth resulting signal that is obtained from a receiver electrode among the plurality of receiver electrodes; and
  adjusting the second positional information using the digital signal of the interference signal to produce adjusted positional information.

19. The method of claim 14,
  reporting the first positional information to a host device, wherein the first positional information triggers an interface action in a graphical user interface operating on the host device.

20. The method of claim 14,
  determining, using the interference determined in the second transmitter electrode, an amount of interference in the plurality of resulting signals;
  determining, using the amount of interference, a sensing frequency of a plurality of sensing signals; and
  transmitting, at the sensing frequency, a plurality of sensing signals over the plurality of transmitter electrodes of the input device.

* * * * *